United States Patent [19]

Vermeersch et al.

[11] Patent Number: 6,080,523
[45] Date of Patent: Jun. 27, 2000

[54] IMAGING ELEMENT FOR PRODUCING A LITHOGRAPHIC PLATE THEREWITH

[75] Inventors: Joan Vermeersch, Deinze; Marc Van Damme, Heverlee; Dirk Kokkelenberg, St.Niklaas; Inge Claes, Kessel, all of Belgium

[73] Assignee: Agfa-Gevaert, N.V., Mortsel, Belgium

[21] Appl. No.: 09/235,318

[22] Filed: Jan. 22, 1999

Related U.S. Application Data

[60] Provisional application No. 60/077,364, Mar. 9, 1998.

[30] Foreign Application Priority Data

Jan. 23, 1998 [EP] European Pat. Off. .............. 98200186

[51] Int. Cl.$^7$ ........................................................ G03F 7/11
[52] U.S. Cl. .................... 430/270.1; 430/302; 430/273.1
[58] Field of Search ................................ 430/162, 273.1, 430/278.1, 302, 270.1

[56] References Cited

U.S. PATENT DOCUMENTS

| | | |
|---|---|---|
| 3,661,579 | 5/1972 | Vrancken et al. . |
| 5,529,884 | 6/1996 | Tutt et al. . |
| 5,759,742 | 6/1998 | West et al. ............................ 430/278.1 |
| 5,879,861 | 3/1999 | Van Damme et al. .................. 430/302 |
| 5,922,502 | 7/1999 | Damme et al. ......................... 430/162 |

FOREIGN PATENT DOCUMENTS

| | | |
|---|---|---|
| 0 770 497 A1 | 5/1997 | European Pat. Off. . |
| 0 803 772 A2 | 10/1997 | European Pat. Off. . |
| 0 816 920 A2 | 1/1998 | European Pat. Off. . |

*Primary Examiner*—Janet Baxter
*Assistant Examiner*—Barbara L. Gilmore
*Attorney, Agent, or Firm*—Breiner & Breiner

[57] ABSTRACT

According to the present invention there is provided an imaging element comprising on a support having a hydrophilic surface in the order given a photosensitive layer insoluble in an aqueous alkaline solution and capable of becoming soluble in said aqueous alkaline solution upon exposure with actinic light and a thermosensitive layer comprising a masking dye rendering said thermosensitive layer opaque to light for which said photosensitive layer has spectral sensitivity and said imaging element further comprising a compound A capable of converting light into heat comprised in said thermosensitive layer or a layer adjacent thereto, characterized in that said thermosensitive layer further comprises thermoplastic particles of a hydrophobic polymer.

10 Claims, No Drawings

IMAGING ELEMENT FOR PRODUCING A LITHOGRAPHIC PLATE THEREWITH

This application claims the benefit of U.S. Provisional Application Ser. No. 60/077,364 filed Mar. 9, 1998.

FIELD OF THE INVENTION

The present invention relates to an imaging element for making a lithographic printing plate wherein that imaging element comprises a thermosensitive mask on a photosensitive coating.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon image-wise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are camera-exposed through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. In particular it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A-60/61752 but has the disadvantage that a complex development and associated developing liquids are needed.

GB-A-1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Systems are also known where a mask is image-wise formed on a photosensitive layer by transfer of a masking substance to the photosensitive coating, e.g. by means of laser transfer or xerography as disclosed in EP-A-1 138. However, such method is generally slow and may not meet the required image resolutions for obtaining high quality prints.

EP-A-803 770 discloses an imaging element for making a lithographic printing plate wherein that imaging element comprises a thermosensitive mask on a photosensitive coating, said thermosensitive mask comprising a masking dye which is capable of being ablated upon exposure with laser light. EP-A-803 769, EP-A-803 771 and EP-A-803 772 describes imaging elements of an analogous kind. A problem that arises with the present ablation based printing plate precursors is that said ablation process can cause formation of debris originating from the ablatable layer itself or of other functional layers of said precursor. Said debris can interfere with transmission of the laser beam (e.g. by depositing on a focusing lens or as an aerosol that partially blocks transmission) or with the transport of the imaging element during or after recording when this debris remains loosely adhered to the plate and deposition of said debris occurs on the transport rollers

OBJECTS OF THE INVENTION

It is an object of the present invention to provide an imaging element for making a lithographic printing plate with a high sensitivity.

It is a further object of the invention to provide an imaging element for making a lithographic printing plate which is not based on ablation.

It is still another object of the invention to provide an imaging element for making a lithographic printing plate with a high printing endurance even without post-bake.

Further objects of the present invention become clear from the description hereinafter.

SUMMARY OF THE INVENTION

According to the present invention there is provided an imaging element comprising on a support having a hydrophilic surface in the order given a photosensitive layer insoluble in an aqueous alkaline solution and capable of becoming soluble in said aqueous alkaline solution upon exposure with actinic light and a thermosensitive layer comprising a masking dye rendering said thermosensitive layer opaque to light for which said photosensitive layer has spectral sensitivity and said imaging element further comprising a compound A capable of converting light into heat comprised in said thermosensitive layer or a layer adjacent thereto, characterized in that said thermosensitive layer further comprises thermoplastic particles of a hydrophobic polymer.

DETAILED DESCRIPTION OF THE INVENTION

It has been found that an imaging element as described above allows for the production of a lithographic plate of high sensitivity and excellent printing endurance. The present invention will now be described in more detail without the intention to limit the invention to any of the embodiments described therein a. Imaging element a.1. Thermosensitive layer In accordance with the present invention, a thermosensitive layer is used that comprises a masking dye rendering said thermosensitive layer opaque to light for which said photosensitive layer has spectral sensitivity. An imaging element in connection with the present invention further comprises a compound A capable of converting light, preferably laser light into heat. This compound A is preferably also comprised in the thermosensitive layer. The compound A is preferably an infrared absorbing compound and the laser light is preferably infrared laser light. More preferably said infrared absorbing compound is an infrared absorbing dye or pigment or a conductive polymer.

In a particularly preferred embodiment in connection with the present invention, the photosensitive layer is sensitive to UV-light and accordingly, a masking dye is a dye that has substantial uv-absorption. Suitable UV absorbing masking dyes have a sufficient high extinction coefficient in the wavelength range from 300 to 450 nm so that with a reasonable amount of masking dye, the amount of UV light penetrating through the thermosensitive layer is not more than 10% and more preferably not more than 1% and most preferably not more than 0.1%. Examples of suitable UV-masking dyes are UVINUL D49, UVINUL E50 and UVINUL N539 from BASF, TINUVIN P from Ciba-Geigy, INTRAWITE OB and INTRAWITE YELLOW 2GLN from Crompton and Knowles Ltd., 4-dimethylaminobenzophenone and 4-phenylazophenol.

A thermosensitive layer for use in connection with the present invention preferably also comprises a compound A capable of converting laser light into heat. It is particularly preferred to use an infrared pigment or dye for that purpose. Particularly desirable in this invention is an infrared dye. However, pigments can be used as well such as e.g. carbon black, a conductive polymer particle, metal carbides, borides, nitrides, carbonitrides, bronze-structured oxides and oxides structurally related to the bronze family but lacking the A component e.g. WO2.9.

Part or all of compound A may be added to a layer adjacent to the thermosensitive layer such as for example an intermediate layer between the photosensitive layer and the thermosensitive layer.

Optionally the thermosensitive layer comprises a hydrophilic binder. Suitable hydrophilic binders for use in a thermosensitive layer in connection with this invention are water soluble polymers for example synthetic homo- or copolymers such as polyvinylalcohol, a poly(meth)acrylic acid, a poly(meth)acrylamide, an alkali soluble copolymer containing acetal groups and hydroxy groups which have at least partially reacted with a compound with at least two carboxyl groups, a polyhydroxyethyl(meth)acrylate, a polyvinylmethylether or natural binders such as gelatin, a polysaccharide such as e.g. dextran, pullulan, cellulose, arabic gum, alginic acid.

The thermoplastic polymer particles preferred in the embodiment of this invention are hydrophobic polymer particles. The hydrophobic thermoplastic polymer particles used in connection with the present invention have a coagulation temperature above 65° C. and more preferably above 70° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. When said polymer particles are subjected to a temperature above coagulation temperature they coagulate to form a hydrophobic agglomerate in the hydrophilic layer so that at these parts the hydrophilic layer becomes insoluble in plain water or an aqueous liquid.

Specific examples of hydrophobic polymer particles for use in connection with the present invention with a Tg above 80° C. are e.g. polyvinyl chloride, polyvinylidene chloride, polyacrylonitrile, polyvinyl carbazole etc. or copolymers thereof. Most preferably used are polystyrene, polymethyl-(meth)acrylate or copolymers thereof.

The weight average molecular weight of the polymers may range from 5,000 to 1,000,000 g/mol.

The hydrophobic particles may have a particle size from 0.01 $\mu$m to 50 $\mu$m more preferably between 0.05 mm and 10 mm and most preferably between 0.04 $\mu$m and 0.15 $\mu$m.

The polymer particles are present as a dispersion in the aqueous coating liquid of the image-forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the image-forming layer is preferably at least 30% by weight and more preferably at least 45% by weight and most preferably at least 60% by weight.

The thermosensitive layer can also comprise crosslinking agents although this is not necessary. Preferred crosslinking agents are low molecular weight substances comprising a methylol group such as for example melamine-formaldehyde resins, glycoluril-formaldehyde resins, thiourea-formaldehyde resins, guanamine-formaldehyde resins, benzoguanamine-formaldehyde resins. A number of said melamine-formaldehyde resins and glycoluril-formaldehyde resins are commercially available under the trade names of CYMEL (Dyno Cyanamid Co., Ltd.) and NIKALAC (Sanwa Chemical Co., Ltd.).

Typically the thickness of the thermosensiyive layer ranges for example from 0.1 $\mu$m to about 4 $\mu$m and more preferably between 0.5 $\mu$m and 1.5 $\mu$m.

A thermosensitive layer in connection with the present invention may further include additional other components to realise various other desired functionalities such as e.g. visual inspection that may be realised by including a colored dye in the thermosensitive layer.

a.2. Photosensitive layer

A photosensitive layer in accordance with the present invention may comprise any suitable light-sensitive composition from which an ink accepting image on the hydrophilic surface of the support of the imaging element can be obtained provided that said composition is insoluble in aqueous alkaline solution and is capable of becoming soluble in said aqueous alkaline solution upon exposure with actinic light. Preferred examples of the light-sensitive compound for such compositions are diazo compounds, which yield a positive working system.

As the diazo compounds used in a positive-working light-sensitive composition, any compounds conventionally known may be utilized and typical examples thereof are o-quinonediazides and preferably o-naphthoquinonediazide compounds. Particularly preferred are o-naphthoquinonediazidosulfonic acid esters or o-naphthoquinone diazidocarboxylic acid esters of various hydroxyl compounds; and o-naphthoquinonediazidosulfonic acid amides or o-naphthoquinonediazidocarboxylic acid amides of various aromatic amine compounds.

Typical examples of o-quinonediazide compounds include esters of benzoquinone-(1,2)-diazidosulfonic acid or napthoquinone-(1,2)-diazidosulfonic acid and phenol-formaldehyde resin or cresol-formaldehyde resin; ester of naphthoquinone-(1,2)-diazido-(2)-5-sulfonic acid and pyrogallol-acetone resin as disclosed in U.S. Pat. No. 3,635,709; and ester of naphthoquinone-(1,2)-diazido-(2)-5-sulfonic acid and resorcin-pyrogallol-acetone copolycondensates as disclosed in J.P. KOKAI No. Sho 55/76346.

Examples of other useful o-quinonediazide compounds are polyesters having hydroxyl groups at their termini esterified with o-napthoquinonediazidesulfonyl chloride as disclosed in J.P. KOKAI No. Sho 50/117503; homopolymers of p-hydroxystyrene or copolymers thereof with other copolymerizable monomers esterified with o-naphtoquinonediazidosulfonyl chloride as disclosed in J.P. KOKAI No. Sho 50/113305; ester of bisphenol-formaldehyde resin and o-quinonediazidosulfonic acid as disclosed in J.P. KOKAI No. Sho 54/29922; condensates of alkyl acrylate-acryloyoxyalkyl carbonate-hydroxyalkyl acrylate copolymers with o-naphthoquinonediaziosulfonyl chloride as disclosed in U.S. Pat. No. 3,859,099; reaction products of copolymerized products of styrene and phenol derivatives with o-quinonediazidosulfonic acid as disclosed in J.P. KOKOKU No. Sho 49/17481; amides of copolymers of p-aminostyrene and monomers copolymerizable therewith and o-naphthoquinonediazidosulfonic acid or o-naphthoquinonediazidocarboxylic acid as disclosed in U.S. Pat. No. 3,759,711; as well as ester compounds of polyhydroxybenzophenone and o-naphthoquinonediazidosulfonyl chloride.

These o-quinonediazide compounds may be used alone, but are preferably used as a mixture with an alkalki-soluble resin to form a light-sensitive layer.

Suitable alkali-soluble resins in connection with this invention comprises phenolic hydroxyl groups. Preferred alkali-soluble resins in connection with this invention are for example synthetic novolac resins such as ALNOVOL, a registered trade mark of Reichold Hoechst and DUREZ, a registered trade mark of OxyChem and synthetic polyvinylfenols such as MARUKA LYNCUR M, a registered trade mark of Dyna Cyanamid. Typical examples of novolac resins are phenolformaldehyde, cresol-formaldehyde resin, and phenol-cresol-formaldehyde copolycondensed resins as disclosed in J.P. KOKAI No. Sho 55/57841. More preferably, the foregoing phenol resins are simultaneously used with a condensate of phenol or cresol substituted with an alkyl group having 3 to 8 carbon atoms and formaldehyde such as t-butylphenol-formaldehyde, as described in J.P. KOKAI No. Sho 50/125806.

Moreover, it is also possible to optionally incorporate, into the light-sensitive composition, alkali-soluble polymers other than the above listed alkali-soluble novolak phenolic resins. Examples of such polymers are styrene-acrylic acid copolymer, methyl methacrylate-methacrylic acid copolymer, alkali-soluble polyurethane resin, and alkali-soluble vinylic resins and alkali-soluble polybutyral resins as disclosed in J.P. KOKOKU No. Sho 52/28401.

The amount of the o-quinonediazide compounds is preferably 5 to 80% by weight and more preferably 10 to 50% by weight based on the total weight of the solid contents of the light-sensitive composition. On the other hand, that of the alkali-soluble resins is preferably 30 to 90% by weight and more preferably 50 to 85% by weight based on the total weight of the solid contents of the light-sensitive composition.

A photosensitive layer in connection with this invention may be applied in the form of a multilayered structure. Moreover, the light-sensitive composition in the photosensitive layer or multi-layer package may further comprise optional components such as dyes, plasticizers and components for imparting printing-out properties (ability of providing a visible image immediately after imagewise exposure).

The coated amount of a photosensitive layer applied onto the hydrophilic surface of a support preferably ranges from 0.1 to 7 $g/m^2$ and more preferably 0.5 to 4 $g/m^2$.

a.3. Support

According to one embodiment of the present invention, the lithographic base having a hydrophilic surface can be an anodised aluminum. A particularly preferred lithographic base having a hydrophilic surface is an electrochemically grained and anodised aluminum support. Most preferably said aluminum support is grained in nitric acid, yielding imaging elements with a higher sensitivity. According to the present invention, an anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is further evident that one or more of these post treatments may be carried out alone or in combination.

According to another embodiment in connection with the present invention, the lithographic base having a hydrophilic surface comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in accordance with the present invention preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas. The thickness of a cross-linked hydrophilic layer may vary in the range of 0.2 to 25 $\mu$m and is preferably 1 to 10 $\mu$m.

Further particular examples of suitable cross-linked hydrophilic layers for use in accordance with the present invention are disclosed in EP-A-601 240, GB-P-1 419 512, FR-P-2 300 354, U.S. Pat. No. 3,971,660, U.S. Pat. No. 4,284,705 and EP-A-514 490.

As substrate on which the hydrophilic layer is provided it is particularly preferred to use a plastic film e.g. substrated polyethylene terephthalate film, cellulose acetate film, polystyrene film, polycarbonate film etc . . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per m$^2$ and 750 mg per m$^2$. Further, the ratio of silica to hydrophilic binder is preferably more than 1 and the surface area of the colloidal silica is preferably at least 300 m$^2$ per gram, more preferably a surface area of 500 m$^2$ per gram.

b. Method for making a lithographic printing plate b.1 image-wise exposure

Image-wise exposure in connection with the present invention involves the use of a laser emitting in the infrared (IR), i.e. emitting in the wavelength range above 700 nm preferably, 700–1500 nm. Particularly preferred for use in connection with the present invention are laser diodes emitting around 830 nm (gallium-arsenide laser diodes) or a NdYAG-laser emitting at 1060 nm.

A preferred imaging apparatus suitable for image-wise exposure in accordance with the present invention preferably includes a laser output that can be provided directly to the imaging elements surface via lenses or other beam-guiding components, or transmitted to the surface of a blank imaging element from a remotely sited laser using a fiber-optic cable. A controller and associated positioning hardware maintains the beam output at a precise orientation with respect to the imaging elements surface, scans the output over the surface, and activates the laser at positions adjacent selected points or areas of the imaging element. The controller responds to incoming image signals corresponding to the original document and/or picture being copied onto the imaging element to produce a precise negative or positive image of that original. The image signals are stored as a bitmap data file on a computer. Such files may be generated by a raster image processor (RIP) or other suitable means. For example, a RIP can accept Input data in page-description language, which defines all of the features required to be transferred onto the imaging element, or as a combination of page-description language and one or more image data files. The bitmaps are constructed to define the hue of the color as well as screen frequencies and angles in case of amplitude modulation screening. However, the present invention is particularly suitable for use in combination with frequency modulation screening as disclosed in e.g. EP-A-571 010, EP-A-620 677 and EP-A-620 674.

The imaging apparatus for use in the present invention is preferably configured as a flatbed recorder or a drum recorder with the imaging element mounted to exterior cylindrical surface of the drum. In a preferred drum configuration, the requisite relative motion between the laser beam and the imaging element is achieved by rotating the drum(and the imaging element mounted thereon) about its axis and moving the beam parallel to the rotation axis, thereby scanning the imaging element circumferentially so the image "grows" in the axial direction. Alternatively, the beam car move parallel to the drum axis and, after each pass across the imaging element, increment angularly so that the image on the imaging element "grows" circumferentially. In both cases, after a complete scan by the beam and development, an image corresponding to the original will have been applied to the surface of the imaging element. In the flatbed configuration, the beam is drawn across either axis of the imaging element, and is indexed along the other axis after each pass. Of course, the requisite relative motion between the beam and the imaging element may be produced by movement of the imaging element rather than (or in addition to) movement of the beam.

Regardless of the manner in which the beam is scanned, it is generally preferable (for reasons of speed) to employ a plurality of lasers and guide their outputs to a single writing array. The writing array is then indexed, after completion of each pass across or along the imaging element, a distance determined by the number of beams emanating from the array, and by the desired resolution (i.e. the number of image points per unit length).

b.2. first development

The image-wise exposed imaging element is developed with an aqueous solution having a pH between 3.5 and 13, most preferably between 4 and 10 in order to remove the non-exposed areas of the thermosensitive layer. The development does not take long, preferably between 10 seconds and 2 minutes and is preferably carried out at a temperature ranging from 15° C. to 35° C.

b.3. overall exposure

Overall exposure in connection with the present invention is carried out by means of a light source that emits at least actinic light, i.e. light in the wavelength range for which the photosensitive layer of an imaging element in connection with the present invention has spectral sensitivity. In a practical embodiment in this invention, the photosensitive layer is UV-sensitive and/or optionally sensitive to the short wavelength part of the visible spectrum e.g. upto green. Overall exposure may for example be carried out by exposure sources such as high or medium pressure halogen mercury vapour lamps, e.g. of 1000 W.

b.4. second development

A second development in connection with the present invention is carried out by a suitable liquid capable of removing the exposed areas of the photosensitive layer. The appropriate composition of a developing liquid in the present invention will depend on the kind of photosensitive layer but is preferably an aqueous liquid having a pH between 10 and 14.

For ecological reasons, it is highly preferred that an aqueous based developing liquid is used preferably without additional organic solvents.

Particularly suitable developing liquids for use with the preferred photosensitive coatings described above are as follows.

A developer preferably used in the invention is an aqueous solutions mainly composed of alkali metal silicates and alkali metal hydroxides. As such alkali metal silicates, preferably used are, for instance, sodium silicate, potassium silicate, lithium silicate and sodium metasilicate. On the other hand, as such alkali metal hydroxides, preferred are sodium hydroxide, potassium hydroxide and lithium hydroxide. From the viewpoint of preventing the formation of insoluble precipitates, it is particularly desirable that the developer comprise at least 20 mole % of potassium with respect to the total amount of alkali metals in the aqueous developing solution.

The developers used in the invention may simultaneously contain other alkaline agents. Examples of such other alkaline agents include such inorganic alkaline agents as ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic alkaline agents as mono-, di- or triethanolamine, mono-, di- or trimethylamine, mono-, di- or triethylamine, mono-, di- or isopropylamine, n-butylamine, mono-, di- or triisopropanolamine, ethyleneimine, ethylenediimine and tetramethylammonium hydroxide.

It is particularly desirable that the molar ratio of silicate [$SiO_2$] to alkali metal oxide [$M_2O$] in a developer for use with this invention is from 0.6 to 1.5, preferably 0.7 to 1.3. In addition, the concentration of $SiO_2$ in the replenisher preferably ranges from 2 to 4% by weight.

In a developer used in the present invention, it is possible to simultaneously use organic solvents having solubility in water at 20° C. of not more than 10% by weight according to need. Examples of such organic solvents are such carboxylic acid esters as ethyl acetate, propyl acetate, amyl acetate, benzyl acetate, ethylene glycol monobutyl acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenze. These organic solvents may be used alone or in combination. Particularly preferred is benzyl alcohol in the invention. These organic solvents are added to the developer generally in an amount of not more than 5% by weight and preferably not more than 4% by weight.

A developer used in the present invention may simultaneously contain a surfactant for the purpose of improving developing properties thereof. Examples of such surfactants include salts of higher alcohol ($C_8$~$C_{22}$) sulfuric acid esters such as sodium salt of lauryl alcohol sulfate, sodium salt of octyl alcohol sulfate, ammonium salt of lauryl alcohol sulfate, Teepol B-81 (trademark available from Shell Chemicals Co., Ltd.) and disodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnapthalene sulfonate, sodium salt of dinaphthalene disulfonate and sodium salt of metanitrobenze sulfonate; sulfonic acid salts of alkylamides; and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

In order to enhance developing stability of the developers the following compounds may simultaneously be used.

Examples of such compounds are neutral salts such as NaCl and KBr as disclosed in J.P. KOKAI No. Sho 58/75152; chelating agents such as EDTA and NTA as disclosed in J.P. KOKAI No. Sho 58/190952 (U.S. Pat. No. 4,469,776); complexes such as [Co(NH3)6]Cl3 as disclosed in J.P. KOKAI No. Sho 59/121336 (U.S. Pat. No. 4,606, 995); ionizable compounds of elements of the group IIa, IIIa or IIIb of the Periodic Table such as disclosed in J.P. KOKAI No. Sho 55/25100; anionic or amphoteric surfactants such as sodium alkyl naphthalene sulfonate and N-tetradecyl-N,N-dihydroxyethyl betaine as disclosed in J.P. KOKAI No. Sho 50/51324; tetramethyldecyne diol as disclosed in U.S. Pat. No. 4,374,920, nonionic surfactants as disclosed in J. P. KOKAI No. Sho 60/213943; cationic polymers such as methyl chloride quaternary products of p-dimethylaminomethyl polystyrene as disclosed in J.P. KOKAI No. Sho 55/95946; amphoteric polyelectrolytes such as copolymer of vinylbenzyl trimethylammonium chloride and sodium sulfites as disclosed in J.P. KOKAI No. Sho 56/142528; reducing inorganic salts such as sodium sulfite as disclosed in J.P. KOKAI No. Sho 57/192952 (U.S. Pat. No. 4,467,027) and alkaline-soluble mercapto compounds or tioether compounds such as thiosalicylic acid, cysteine and thioglycolic acid; inorganic lithium compounds such as lithium chloride as disclosed in J.P. KOKAI No. Sho 58-95444; organic lithium compounds such as lithium benzoate as disclosed in Japanese Patent Publication for Opposition Purpose (hereinafter referred to as J.P. KOKOKU) No. Sho 50/34442; organicometallic surfactants containing Si, Ti or the like as disclosed in J.P. KOKAI No. Sho 59/75255; organoboron compounds as disclosed in J.P. KOKAX No. Sho 59/84241 (U.S. Pat. No. 4,500,625); quaternary ammonium salts such as tetraalkylammonium oxides as disclosed in EP-A-101 010; and bacterides such as sodium dehydroacetate.

After the development of an overall exposed imaging element with an alkaline developer and optionally drying, the plate is preferably rinsed with water. The plate is then dried and preferably gummed. The obtained plate may then be used as a printing plate as such. However, to improve durability it is still possible to bake said plate at a temperature between 200° C. and 300° C. for a period of 30 seconds to 5 minutes.

The present invention will now be further illustrated by way of the following examples without any intention to limit the invention thereto. All parts are by weight unless stated otherwise.

EXAMPLE 1

An IR-sensitive toplayer was coated onto an OZASOL P51-plate (a positive UV-sensitive printing plate commercially available from Agfa) from a 10% wt solution (pH≈7)

in deionized water with a wet thickness of 16 μm. The resulting toplayer contained 85% of polymethylmetacrylate (the UV-absorber according to formula I built in), 10% of carbon black, and 5% of a compound according to formula II wherein n is 70%, p is 3%, m+q is 27% with a molecular weight of 60,000 in water.

This material was imaged with an external drum IR-laser imaging apparatus (diode laser 830 nm, drumspeed 3.2 m/s, at addressabilities 3600 dpi, power level in image plane 160 mW ), and developed in an aqueous developing solution (OZASOL EN144 negative developer commercially available from Agfa) having a pH=8.3 in a POLYCHROME PC28E (a processor commercially available from Polychrome). Additionally an UV exposure was carried out on a contact frame type CDL 1502 I (commercially available from Agfa), level 3, exposure time 75 seconds.(being resolution exposure for OZASOL P51) and subsequently the exposed element was developed in an aqueous developing solution (OZASOL EP262A positive developer commercially available from Agfa) having a pH>12 in a TECHNI-GRAPH NPX-32 (a processor commercially available from Technigraph).

A good image was obtained (2% dots of 2001 pi screen were rendered) and the plate was printed on an HEIDELBERG GTO printing machine with a conventional ink (K+E) and fountain solution (Rotamatic), resulting in good prints, i.e. no scumming in non-imaged parts and good ink-uptake in imaged parts.

EXAMPLE 2

An IR-sensitive toplayer was coated onto an OZASOL P51-plate (a positive UV-sensitive printing plate commercially available from Agfa) from a 10% wt solution (pH≈7) in deionized water with a wet thickness of 16 μm. The resulting toplayer contained 85% of polystyrene, 10% of carbon black, and 5% of a compound according to formula II wherein n is 70%, p is 3%, m+q is 27% with a molecular weight of 60,000 in water.

This material was imaged with an external drum IR-laser imaging apparatus (diode laser 830 nm, drumspeed 3.2 m/s, at addressabilities 3600 dpi, power level in image plane 320 mW ), and developed in an aqueous developing solution (OZASOL EN144 negative developer commercially available from Agfa) having a pH=8.3 in a POLYCHROME PC28E (a processor commercially available from Polychrome). Additionally an UV exposure was carried out on a contact frame type CDL 1502 I (commercially available from Agfa), level 3, exposure time 35 seconds.(being sufficient exposure to completely wash away OZASOL P51) and subsequently the exposed element was developed in an aqueous developing solution (OZASOL EP26A positive developer commercially available from Agfa/water 85:15) having a pH>12 in a TECHNIGRAPH NPX-32 (a processor commercially available from Technigraph).

A good image was obtained (2% dots of 2001 pi screen were rendered) and the plate was printed on an HEIDELBERG GTO printing machine with a conventional ink (ABDick 1020) and fountain solution (Rotamatic), resulting in good prints,i.e. no scumming in non-imaged parts and good ink-uptake in imaged parts.

Having described in detail preferred embodiments of the current invention, it will now be apparent to those skilled in the art that numerous modifications can be made therein without departing from the scope of the invention as defined in the appending claims.

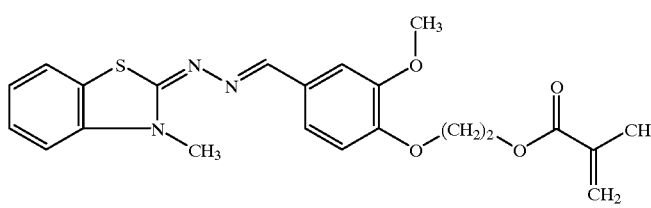

Form I

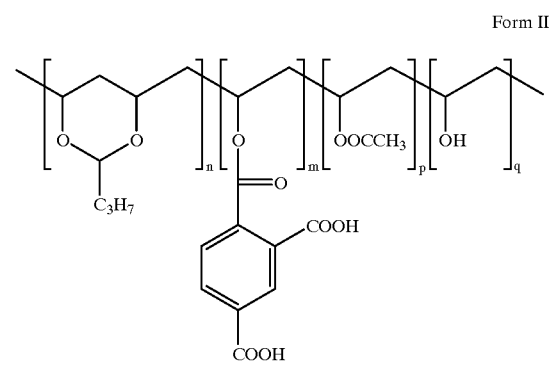

Form II

What is claimed is:

1. An imaging element for use in forming lithographic printing plates comprising on a support having a hydrophilic surface in the order given a photosensitive layer insoluble in an aqueous alkaline solution and capable of becoming soluble in said aqueous alkaline solution upon exposure with actinic light and a thermosensitive layer comprising a masking dye rendering said thermosensitive layer opaque to light for which said photosensitive layer has spectral sensitivity and said imaging element further comprising a compound A capable of converting light into heat comprised in said thermosensitive layer or a layer adjacent thereto, characterized in that said thermosensitive layer further comprises thermoplastic particles of a hydrophobic polymer.

2. An imaging element according to claim 1 wherein said thermosensitive layer further comprises a hydrophilic binder.

3. An imaging element according to claim 1 wherein said thermoplastic particles have a particle size from 0.04 μm to 0.15 μm.

4. An imaging element according to claim 1 wherein the thermoplastic particles have a coagulation temperature above 65° C.

5. An imaging element according to claim 1 wherein the photosensitive layer comprises an o-naphthoquinonediazide compound.

6. An imaging element according to claim 1 wherein the photosensitive layer comprises an alkali-soluble resin containing phenolic hydroxyl groups.

7. An imaging element according to claim 1 wherein the support having a hydrophilic surface is an anodized aluminum support treated with a compound selected from the group consisting of polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde.

8. A method for making a lithographic printing plate comprising the steps of:

image-wise exposing with IR-irradiation an imaging element according to claim 1;

developing said image-wise exposed imaging element with an aqueous solution having a pH between 3.5 and 13 in order to remove the non-exposed areas of the thermosensitive layer;

overall exposing the imaging element by means of a light source that emits at least actinic light; and developing said imaging element with an aqueous liquid having a pH between 10 and 14 capable of removing the exposed areas of the photosensitive layer.

9. A method for making a lithographic printing plate according to claim 8 wherein the imaging element is gummed after the second development step.

10. A method according to claim 8 wherein the imaging element is baked after the second development step.

* * * * *